(12) United States Patent
Tsuyama et al.

(10) Patent No.: US 11,659,673 B2
(45) Date of Patent: May 23, 2023

(54) INFORMATION PROCESSING METHOD, INFORMATION PROCESSING APPARATUS, AND PROGRAM

(71) Applicant: SEIKO EPSON CORPORATION, Tokyo (JP)

(72) Inventors: Kazuhiko Tsuyama, Kitakyushu (JP); Hiromichi Kitsuki, Kitakyushu (JP); Shuichi Kadota, Fukuoka (JP)

(73) Assignee: Seiko Epson Corporation, Tokyo (JP)

( * ) Notice: Subject to any disclaimer, the term of this patent is extended or adjusted under 35 U.S.C. 154(b) by 55 days.

(21) Appl. No.: 17/132,289

(22) Filed: Dec. 23, 2020

(65) Prior Publication Data

US 2021/0204432 A1   Jul. 1, 2021

(30) Foreign Application Priority Data

Dec. 26, 2019  (JP) .............................. JP2019-235897

(51) Int. Cl.
*H05K 5/02* (2006.01)
*H04N 1/00* (2006.01)
*H01R 11/12* (2006.01)

(52) U.S. Cl.
CPC ....... *H05K 5/0247* (2013.01); *H04N 1/00557* (2013.01); *H01R 11/12* (2013.01)

(58) Field of Classification Search
CPC ... H05K 5/0247; H04N 1/00557; H01R 11/12
USPC ......................................................... 358/305
See application file for complete search history.

(56) References Cited

U.S. PATENT DOCUMENTS

| | | | | |
|---|---|---|---|---|
| 5,162,845 A | * | 11/1992 | Ariyama | ................ G03G 15/00 399/361 |
| 2007/0229590 A1 | * | 10/2007 | Kadota | .................. B41J 25/304 347/37 |

FOREIGN PATENT DOCUMENTS

JP     2019-029794 A    2/2019

* cited by examiner

*Primary Examiner* — Darryl V Dottin
(74) *Attorney, Agent, or Firm* — Workman Nydegger

(57) ABSTRACT

An image reading apparatus includes a lower unit, an upper unit, a flexible flat cable (FFC), a GND harness, an accommodating portion, and a widened portion. The lower unit includes a main board. The upper unit includes a sub-board and is pivotably connected to the lower unit. The FFC and the GND harness have flexibility and couple the main board and the sub-board to each other. The accommodating portion accommodates the FFC and the GND harness. A length of the GND harness in a width direction is larger than a length corresponding to a gap between the accommodating portion and the FFC.

8 Claims, 16 Drawing Sheets

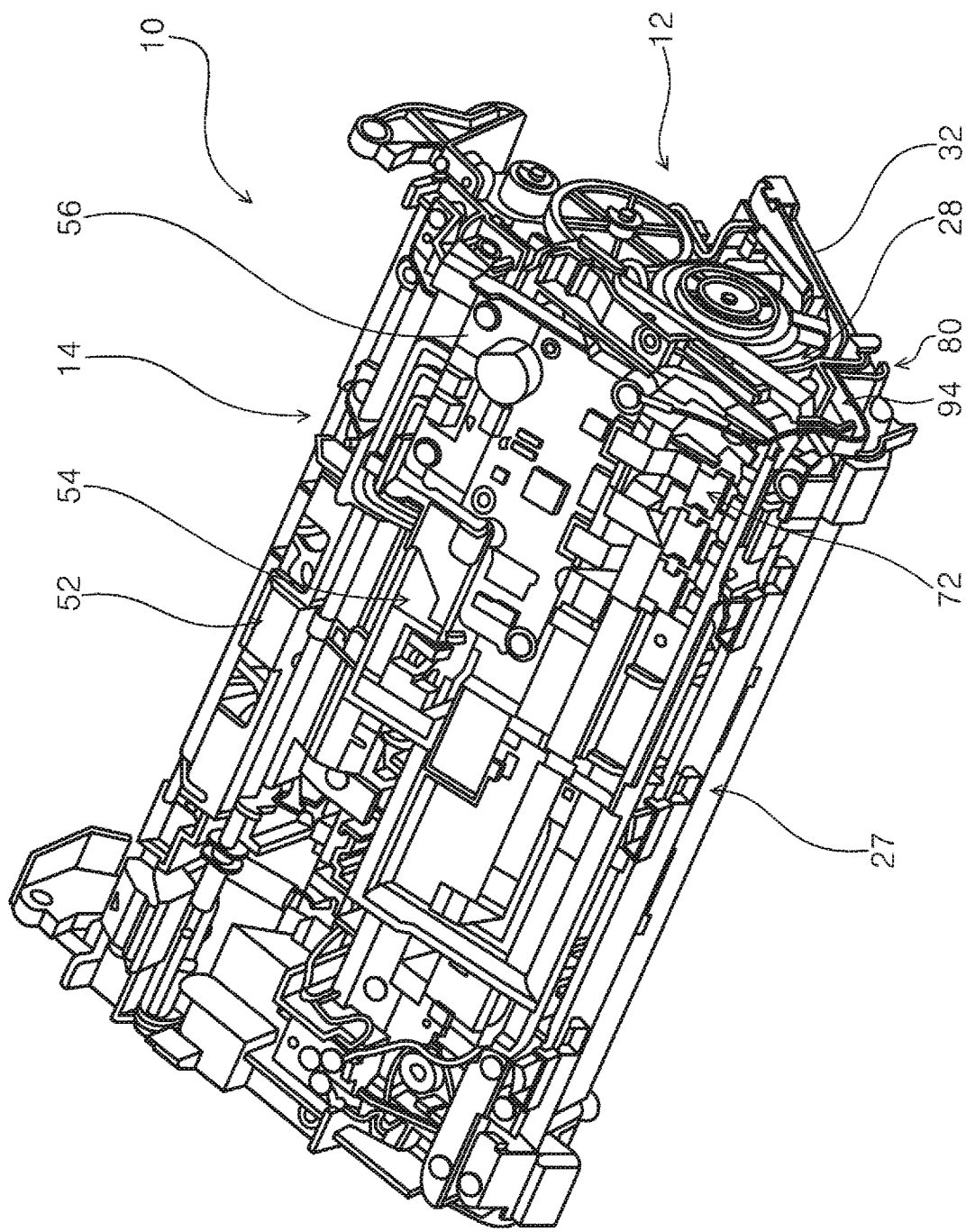
FIG. 3
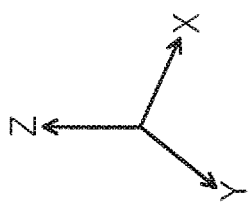

INFORMATION PROCESSING METHOD, INFORMATION PROCESSING APPARATUS, AND PROGRAM

The present application is based on, and claims priority from JP Application Serial Number 2019-235897, filed Dec. 26, 2019, the disclosure of which is hereby incorporated by reference herein in its entirety.

BACKGROUND

1. Technical Field

The present disclosure relates to an image reading apparatus.

2. Related Art

An image reading apparatus in which a lower unit and an upper unit are pivotably connected to each other is known in the related art, and an example thereof is disclosed in JP-A-2019-29794.

In the image reading apparatus described in JP-A-2019-29794, a main substrate in the lower unit and a substrate in the upper unit are coupled to each other through a cable.

In the image reading apparatus described in JP-A-2019-29794, it is conceivable that the cable accommodated in an accommodating portion of a unit is composed of a signal wiring member for a signal and a ground wiring member for grounding having a width smaller than that of the signal wiring member. In this configuration, when one of the two units is pivoted, there is a possibility that the bent ground wiring member will enter a gap between the accommodating portion and the signal wiring member and press the signal wiring member against the accommodating portion, such that the signal wiring member will be worn.

SUMMARY

According to an aspect of the present disclosure, an image reading apparatus includes: a first unit that includes a first substrate portion; a second unit that includes a second substrate portion and is pivotably connected to the first unit; a signal wiring member that has flexibility and couples the first substrate portion and the second substrate portion to each other; a ground wiring member that has flexibility and couples the first substrate portion and the second substrate portion to each other; and an accommodating portion that is provided in at least one of the first unit and the second unit and accommodates the signal wiring member and the ground wiring member, wherein a length of the ground wiring member in a width direction is larger than a length corresponding to a gap between the accommodating portion and the signal wiring member in the width direction.

BRIEF DESCRIPTION OF THE DRAWINGS

FIG. 3 is a perspective view showing an internal structure of the scanner according to the first embodiment.

DESCRIPTION OF EXEMPLARY EMBODIMENTS

Figure 1:
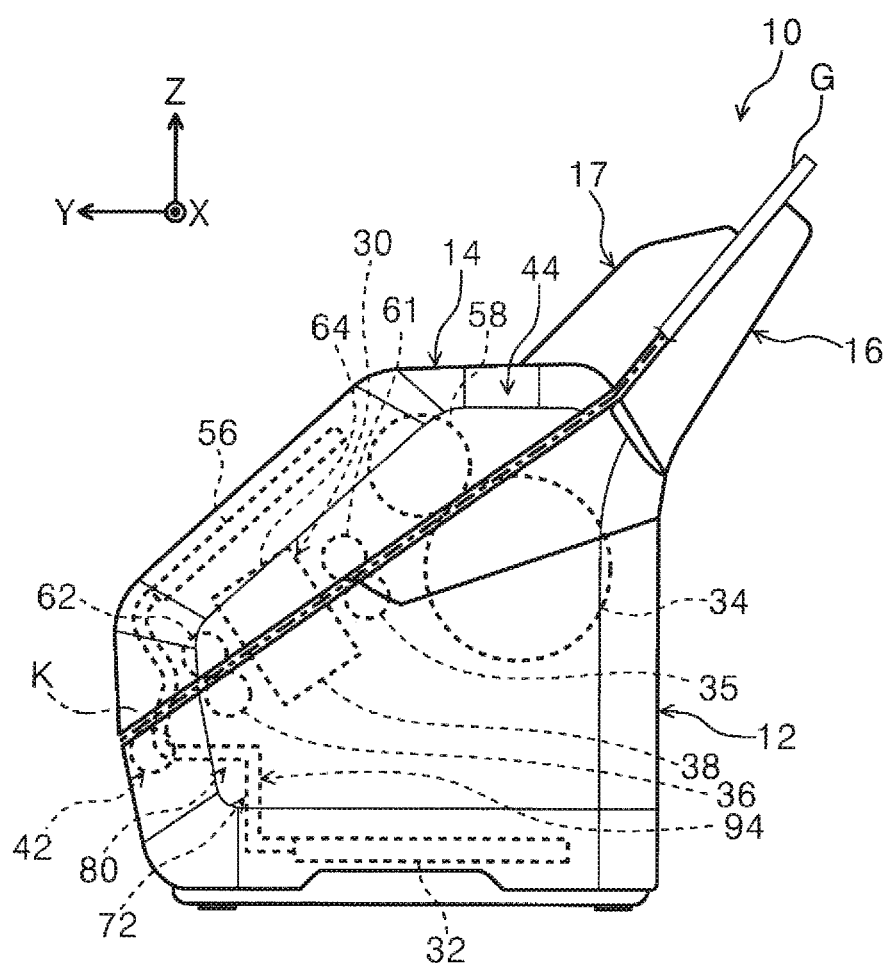
FIG. 1 is a side view of a scanner according to a first embodiment in a closed state.

Hereinafter, the present disclosure will be briefly described.

An image reading apparatus according to a first aspect of the present disclosure includes: a first unit that includes a first substrate portion; a second unit that includes a second substrate portion and is pivotably connected to the first unit; a signal wiring member that has flexibility and couples the first substrate portion and the second substrate portion to each other; a ground wiring member that has flexibility and couples the first substrate portion and the second substrate portion to each other; and an accommodating portion that is provided in at least one of the first unit and the second unit and accommodates the signal wiring member and the ground wiring member, wherein a length of the ground wiring member in a width direction is larger than a length corresponding to a gap between the accommodating portion and the signal wiring member in the width direction.

According to the present aspect, the length of the ground wiring member is larger than the length corresponding to the gap between the accommodating portion and the signal wiring member, in the width direction, and it is thus suppressed that the ground wiring member enters the gap between the accommodating portion and the signal wiring member. As a result, it is suppressed that the signal wiring member receives a pressing force in the width direction from the ground wiring member, such that contact between the signal wiring member and the accommodating portion is suppressed, and it is thus possible to suppress wear of the signal wiring member.

In an image reading apparatus according to a second aspect, in the first aspect, the ground wiring member includes: a narrow portion; and a wide portion that has a width larger than a length corresponding to a width of the narrow portion in the width direction.

According to the present aspect, the wide portion can be arranged only in a portion where the gap between the accommodating portion and the signal wiring member is formed, and it is thus possible to suppress that a part of the ground wiring member becomes useless as compared with a configuration in which the entire ground wiring member is the wide portion.

In an image reading apparatus according to a third aspect, in the second aspect, the wide portion is formed integrally with the narrow portion and is widened in the width direction from the narrow portion.

According to the present aspect, when the ground wiring member and the wide portion are accommodated in the accommodating portion, the wide portion is formed integrally with the narrow portion, such that the narrow portion and the wide portion are deformed at the same position in a length direction, and a work of accommodating the ground wiring member in the accommodating portion can thus be facilitated.

In an image reading apparatus according to a fourth aspect, in the second aspect, the narrow portion is a linear member, and the wide portion is a plate-shaped member which is provided separately from the linear member and has a width larger than a length of the narrow portion in the width direction, and in which a plurality of hole portions through which the narrow portion is inserted are formed.

According to the present aspect, the wide portion is configured as a plate-shaped member separate from the linear member. As a result, a position of the wide portion is shifted in a length direction intersecting with the width direction of the ground wiring member, and adjustment of the position of the wide portion can thus be facilitated.

In an image reading apparatus according to a fifth aspect, in any one of the second to fourth aspects, the wide portion overlaps a curved portion of the signal wiring member curved in accordance with pivot of the second unit, in a thickness direction of the signal wiring member.

According to the present aspect, the wide portion overlaps the curved portion in the thickness direction. As a result, in the curved portion more easily coming into contact with the accommodating portion than a straight line-shaped portion of the signal wiring member, it is suppressed that the ground wiring member enters a gap between the curved portion and the accommodating portion, and it is thus possible to further suppress the wear of the signal wiring member.

In an image reading apparatus according to a sixth aspect, in any one of the second to fifth aspects, the accommodating portion is provided with a facing portion facing the wide portion in a length direction of the ground wiring member.

According to the present aspect, by pivoting the second unit with respect to the first unit, when the ground wiring member is pulled toward the second unit, the wide portion comes into contact with the facing portion, such that movement of the ground wiring member is restricted. As a result, it is possible to suppress positional deviation of the wide portion in the length direction when the second unit is pivoted.

In an image reading apparatus according to a seventh aspect, in any one of the first to sixth aspects, a part of the accommodating portion overlaps a pivot shaft portion in an axial direction of the pivot shaft portion, the pivot shaft portion connecting the first unit and the second unit to each other.

According to the present aspect, when the second unit is pivoted with respect to the first unit, a displacement amount of the second unit is the smallest at the pivot shaft portion. Here, since displacement amounts of the signal wiring member and the ground wiring member are reduced by locating a part of the accommodating portion at a portion where the displacement amount of the second unit is the smallest, it is possible to suppress wear of the signal wiring member in accordance with the pivot of the second unit.

In an image reading apparatus according to an eighth aspect, in any one of the first to seventh aspect, the accommodating portion includes a first accommodating portion provided in the first unit and a second accommodating portion provided in the second unit, and at least one of the first accommodating portion and the second accommodating portion is provided with a restricting portion that restricts movement of the signal wiring member in the width direction.

According to the present aspect, the movement of the signal wiring member in the width direction is restricted by the restricting portion in at least one of the first accommodating portion and the second accommodating portion, such that contact between the accommodating portion and the signal wiring member is suppressed, and it is thus possible to suppress the wear of the signal wiring member as compared with a configuration that does not have the restricting portion.

First Embodiment

Hereinafter, a scanner 10 according to a first embodiment will be described in detail with reference to the accompanying drawings as an example of an image reading apparatus according to the present disclosure. In an X-Y-Z coordinate system shown in each drawing, in the scanner 10, an X-axis direction is an apparatus width direction, a Y-axis direction is an apparatus depth direction, and a Z-axis direction is an apparatus height direction.

Note that when a left side and a right side when viewed from a front side, which is a side on which the scanner 10 is used, are distinguished from each other in the apparatus width direction, the right side is referred to as a +X side and the left side is referred to as a −X side. When a front side and a rear side are distinguished from each other in the apparatus depth direction, the front side is referred to as a +Y side and the rear side is referred to as a −Y side. When an upper side and a lower side are distinguished from each other in the apparatus height direction, the upper side is referred to as a +Z side and the lower side is referred to as a −Z side.

Outline of Scanner

The scanner 10 is shown in FIG. 1.

Figure 7:
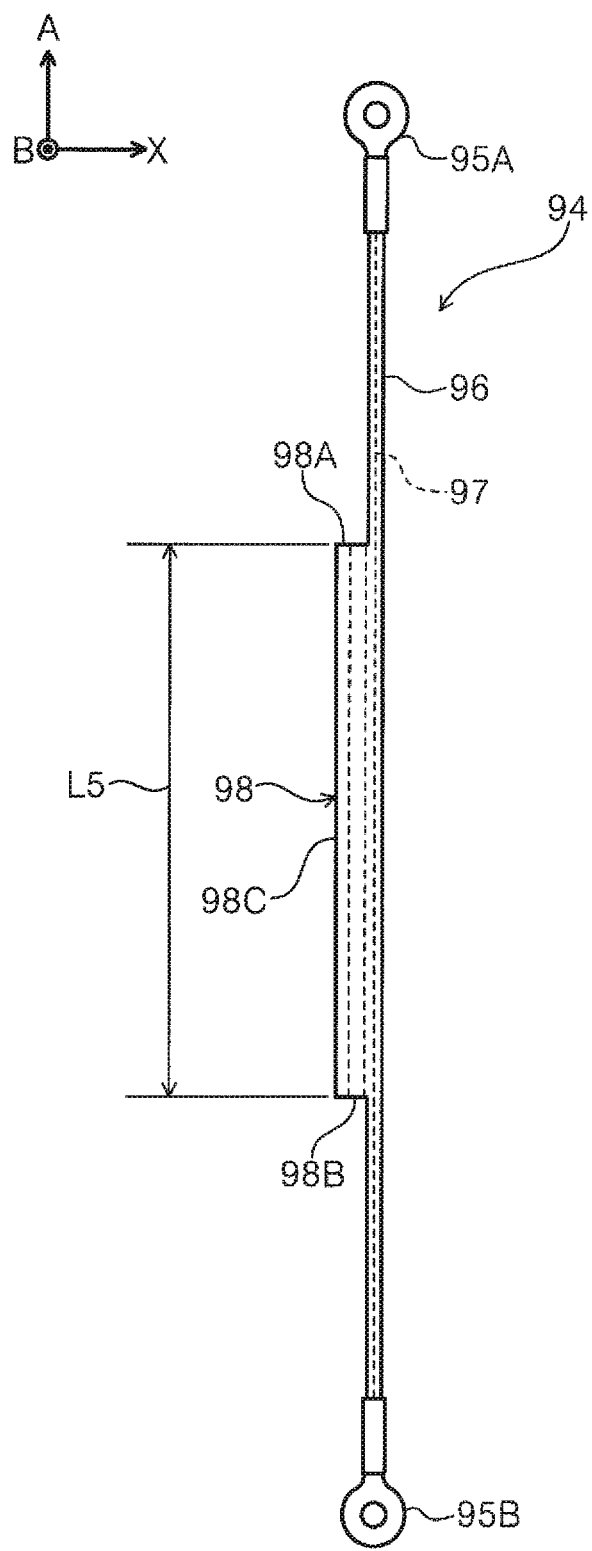
FIG. 7 is a plan view of the GND harness of the scanner according to the first embodiment.

The scanner 10 includes a lower unit 12, an upper unit 14, a flexible flat cable (FFC) 72, a ground (GND) harness 94, an accommodating portion 80, and a widened portion 98 (FIG. 7). Further, the scanner 10 has a mounting portion 16 on which a document G is mounted and a reading portion 30 for reading the document G.

Lower Unit

The lower unit 12 is an example of a first unit, and has a substantially trapezoidal shape with the +Y side as an upper bottom and the −Y side as a lower bottom when viewed from the X-axis direction. An upper portion of the lower unit 12 on the +Z side is inclined toward a front lower side.

An upper unit 14 to be described later is arranged on the +Z side of the lower unit 12. In this state, a portion between the lower unit 12 and the upper unit 14 is a transport path K through which the document G is transported.

Figure 2:
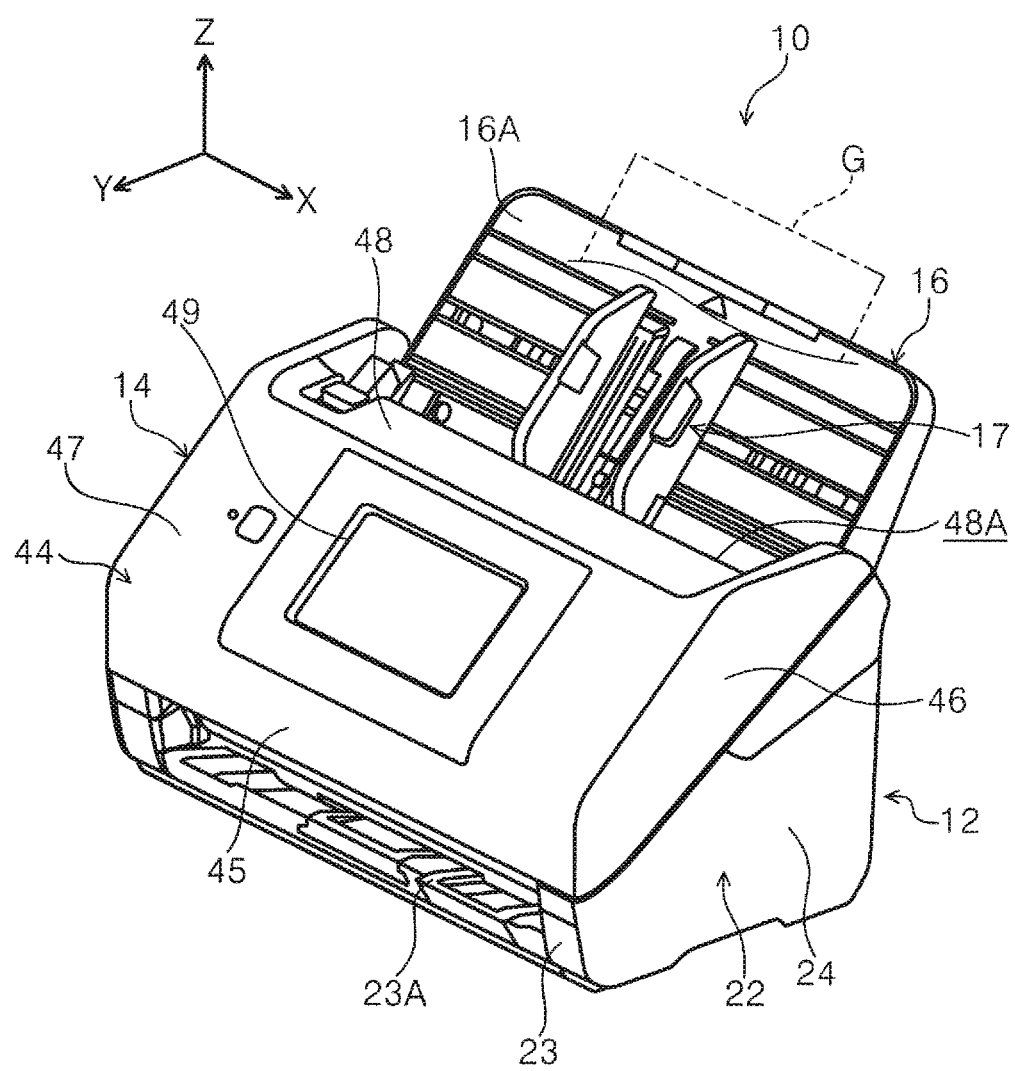
FIG. 2 is a perspective view of the scanner according to the first embodiment when viewed obliquely from the front.

As shown in FIG. 2, the lower unit 12 has a cover portion 22 constituting an outer wall. The cover portion 22 has a front cover 23 located on the +Y side with respect to the center of the lower unit 12, side covers 24 each located on the +X side and the −X side with respect to the center of the lower unit 12, and a rear cover 25 (FIG. 16) located on the −Y side with respect to the center of the lower unit 12. A discharge port 23A through which the document G is discharged is formed in the front cover 23.

As shown in FIG. 3, the lower unit 12 includes a base frame 27, side frames 28, and a main board 32 inside the cover portion 22 (FIG. 2).

The base frame 27 constitutes a body portion of the lower unit 12.

The side frames 28 are provided at both end portions of the base frame 27 in the X-axis direction and stand upright along a Y-Z plane. In addition, the side frame 28 is configured to include a vertical wall 28A (FIG. 4) that stands upright along the Y-Z plane. Note that in the present embodiment, a phrase "A is provided with B" includes not only a configuration in which B is provided as a member different from A, but also a configuration in which B is integrated with A, that is, B is formed in A.

The main board 32 is an example of a first substrate, and functions as a control unit that controls an operation of each portion of the scanner 10. A shield member 33 (FIG. 4) is attached to a lower surface of the main board 32.

As shown in FIG. 1, the lower unit 12 is further provided with a feeding roller 34, transport rollers 35 and 36, a lower sensor 38, and one side of a hinge portion 42.

The feeding roller 34 rotates together with a separating roller 58 to be described later to feed the document G into the transport path K.

The transport rollers 35 and 36 transport the document G to a downstream of the transport path K together with transport rollers 61 and 62 to be described later.

The lower sensor 38 reads information of a rear surface of the document G on the −Z side. The information read by the lower sensor 38 is sent to the main board 32.

Figure 4:
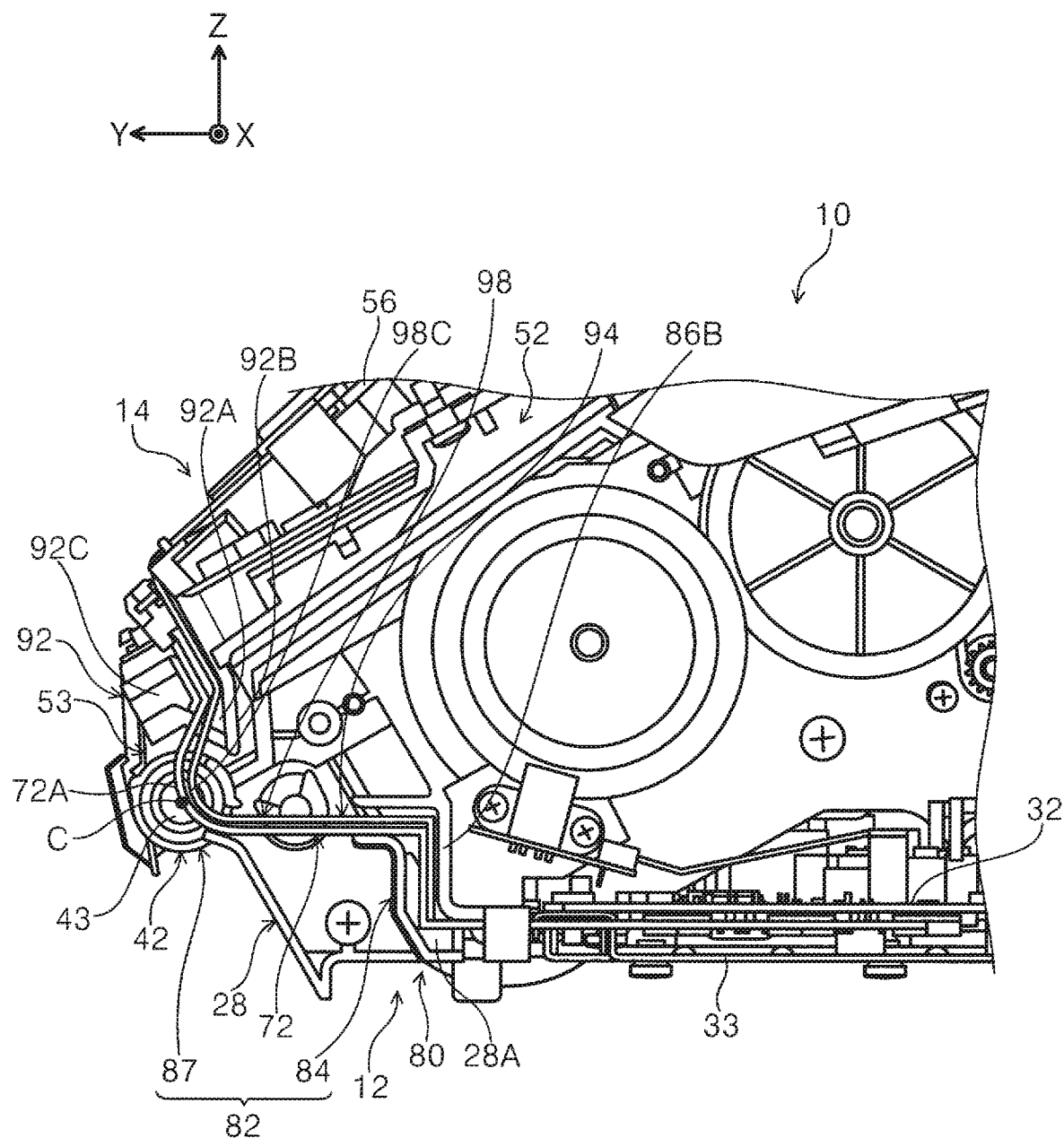
FIG. 4 is a side view showing the internal structure of the scanner according to the first embodiment.

As shown in FIG. 4, the hinge portion 42 is a portion where a +Y side end portion of the side frame 28 with respect to the center of the side frame 28 and a −Z side end portion of an upper main frame 52 to be described later in a +Y side portion of the upper main frame 52 with respect to the center of the upper main frame 52 are connected to each other in the X-axis direction. In addition, the hinge part 42 is formed in a circular shape when viewed from the X-axis direction. In the hinge portion 42, a shaft (not shown) is fixed by a screw 43, and the upper unit 14 is pivotable around the shaft.

As described above, in the hinge portion 42, the upper unit 14 is pivotably supported around a pivot axis C along the X-axis direction. Note that in FIG. 4, the pivot axis C is denoted by point C. A direction of the pivot axis C (pivot axis direction) is, for example, the X-axis direction.

Upper Unit

As shown in FIG. 1, the upper unit 14 is an example of a second unit, and is pivotably connected to the lower unit 12 via the hinge portion 42.

In the following description, a state in which the upper unit 14 is located on the +Z side of the lower unit 12 is referred to as a closed state of the upper unit 14. In addition, a state in which the transport path K is exposed by pivoting the upper unit 14 at the hinge portion 42 is referred to as an opened state of the upper unit 14.

As shown in FIG. 2, the upper unit 14 has a cover portion 44 constituting an outer wall. The cover portion 44 has a front cover 45 located on the +Y side with respect to the center of the upper unit 14, side covers 46 each located on the +X side and the −X side with respect to the center of the upper unit 14, an inclined cover 47 extending from the front cover 45 toward a rear upper side, and an upper cover 48 located on the +Z side with respect to the center of the upper unit 14.

A feed port 48A into which the document G is fed is formed in the upper cover 48.

An operation panel 49 is attached to the inclined cover 47.

As shown in FIG. 3, the upper unit 14 includes an upper main frame 52, an upper sub-frame 54, and a sub-board 56 inside the cover portion 44 (FIG. 2).

The upper main frame 52 constitutes a body portion of the upper unit 14.

The upper sub-frame 54 is superimposed on the upper main frame 52 from the +Z side and is attached to the upper main frame 52.

The sub-board 56 is an example of a second substrate, and is attached to the upper sub-frame 54. In addition, the sub-board 56 is coupled to the operation panel 49 (FIG. 2) and functions as a relay board connecting the operation panel 49 and the main board 32 to each other.

As shown in FIG. 1, the upper unit 14 is further provided with a separation roller 58, transport rollers 61 and 62, an upper sensor 64, and the other side of the hinge portion 42.

The separation roller 58 feeds the documents G one by one into the transport path K.

The upper sensor 64 reads information on a front surface of the document G on the +Z side. The information read by the upper sensor 64 is sent to the main board 32. Note that the reading portion 30 is composed of the lower sensor 38 and the upper sensor 64.

A portion of the upper unit 14 constituting the other side of the hinge portion 42 is referred to as a pivot shaft portion 53 (FIG. 4). The pivot shaft portion 53 overlaps a portion of the lower unit 12 constituting one side of the hinge portion 42, in the X-axis direction, and constitutes the hinge portion 42 together with a portion of the lower unit 12 side.

Mounting Portion

As shown in FIG. 2, the mounting portion 16 extends from a portion, which is a −Y side end portion and a +Z side end portion of the lower unit 12, toward a rear upper side. A mounting surface 16A of the mounting portion 16 on which the document G is mounted is connected to the transport path K (FIG. 1). The mounting surface 16A is provided with a side guide 17 determining a position of the document G in the X-axis direction.

Accommodating Portion

As shown in FIG. 4, the accommodating portion 80 is provided in the lower unit 12 and the upper unit 14. In addition, the accommodating portion 80 accommodates an FFC 72 and a GND harness 94 to be described later. Note that the "accommodation" in the present embodiment is not limited to a state in which the FFC 72 and the GND harness 94 are entirely accommodated in the accommodating portion 80, and also includes a state in which a part of each of the FFC 72 and the GND harness 94 is accommodated in the accommodating portion 80 and the remaining part is exposed. Specifically, the accommodating portion 80 includes, for example, a lower accommodating portion 82 and an upper accommodating portion 92. The accommodating portion 80 is provided with a support member 83 (FIG. 8) to be described later.

Lower Accommodating Portion

Figure 5:
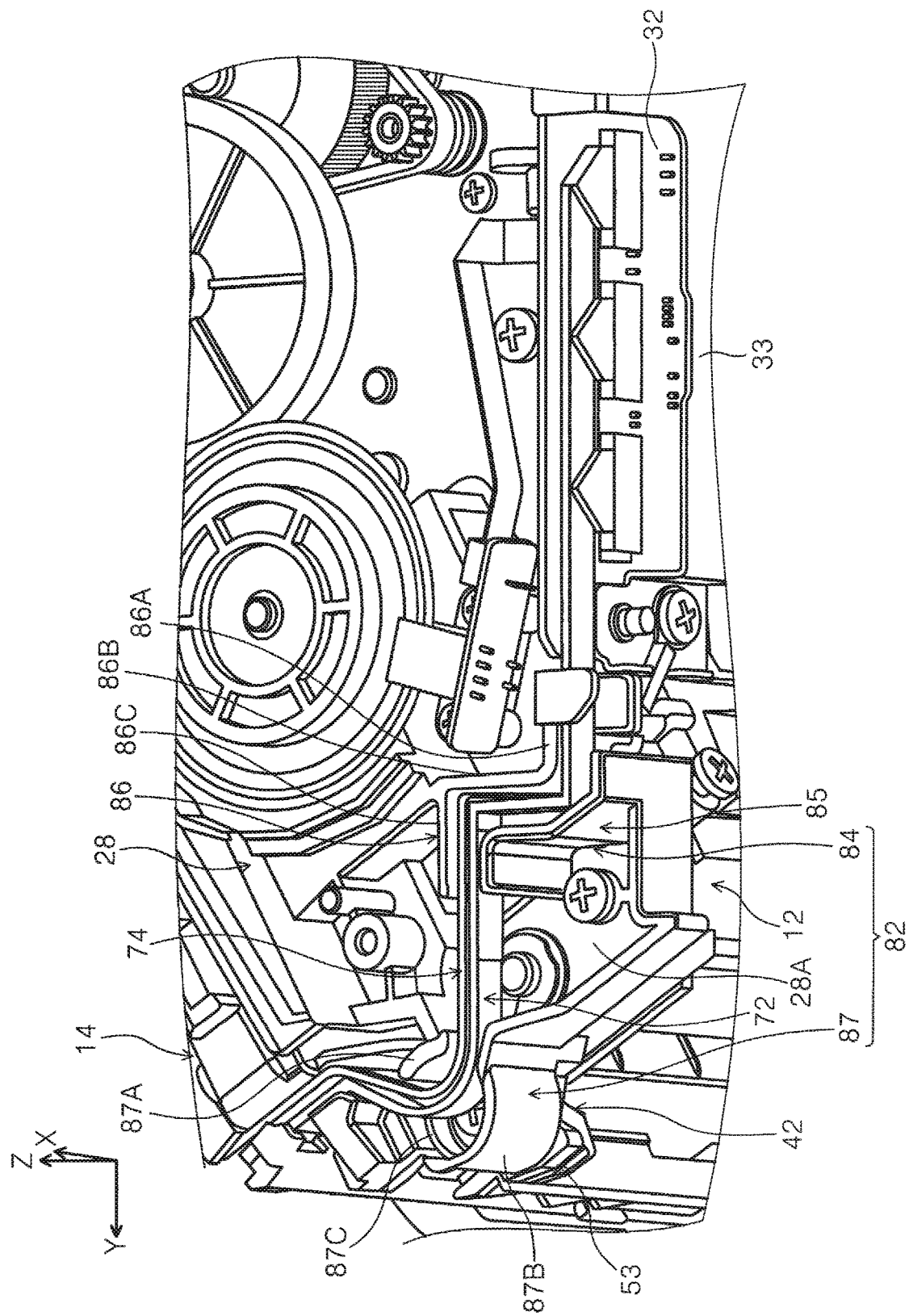
FIG. 5 is a perspective view of the scanner according to the first embodiment when viewed obliquely from the bottom.

As shown in FIG. 5, the lower accommodating portion 82 is an example of a first accommodating portion, and is provided at a +X side end portion of the lower unit 12. In addition, the lower accommodating portion 82 is formed between the main board 32 and the hinge portion 42 in the side frame 28 on the +X side. Specifically, the lower accommodating portion 82 includes a rear accommodating portion 84 located on the +Y side with respect to the main board 32 and a front accommodating portion 87 located on the +Y side with respect to the rear accommodating portion 84.

Note that a +X side portion of the lower accommodating portion 82 with respect to the center of the lower accommodating portion 82 in the X-axis direction is configured by a support member 83 (FIG. 8) to be described later. In other words, a part of a +X side opening of the rear accommodating portion 84 is covered with the support member 83.

The rear accommodating portion 84 is formed in a crank shape as a whole when viewed from the X-axis direction. Specifically, the rear accommodating portion 84 includes the vertical wall 28A, a lower rib 85 protruding from the vertical wall 28A to the +X side, and an upper rib 86 protruding from the vertical wall 28A to the +X side and arranged at an interval from the lower rib 85. In other words, the rear accommodating portion 84 is a groove portion having a U-shaped cross section that opens to the +X side. A length of the lower rib 85 and the upper rib 86 corresponding to a height from the vertical wall 28A is larger than a length corresponding to a width of an FFC 72 to be described later in the X-axis direction.

The upper rib 86 is formed in a crank shape when viewed from the X-axis direction, and has a lower wall portion 86A, a vertical wall portion 86B, and an upper wall portion 86C.

The lower wall portion 86A extends along the Y-axis direction.

The vertical wall portion 86B extends from a +Y side end portion of the lower wall portion 86A to the +Z side. In addition, the vertical wall portion 86B is an example of a facing portion, and faces a widened portion 98 (FIG. 7) to be described later in a length direction of the GND harness 94.

The upper wall portion 86C extends from a +Z side end portion of the vertical wall portion 86B to the +Y side.

The front accommodating portion 87 is provided in the hinge portion 42. In other words, a part of the accommodating portion 80 overlaps the pivot shaft portion 53 of the upper unit 14 in the pivot axis direction of the upper unit 14. Specifically, the front accommodating portion 87 has a rear rib 87A, a front rib 87B, and an upper rib 87C each formed in an arc shape when viewed in the X-axis direction. The rear rib 87A, the front rib 87B, and the upper rib 87C protrude from an outer peripheral edge of the hinge portion 42 to the +X side.

The rear rib 87A is located on the −Y side and the +Z side with respect to the pivot axis C (FIG. 4) when viewed from the X-axis direction.

The front rib 87B is located on the +Y side and the −Z side with respect to the pivot axis C when viewed from the X-axis direction, and faces the rear rib 87A at an interval from the rear rib 87A in a radial direction. Heights of the front rib 87B and the rear rib 87A in the X-axis direction are substantially the same as each other.

The upper rib 87C is located on the +Z side with respect to the pivot axis C when viewed from the X-axis direction.

A height of the upper rib 87C in the X-axis direction is lower than half the height of the rear rib 87A in the X-axis direction.

Therefore, the front accommodating portion 87 is opened on the −Y side and the +Z side.

Upper Accommodating Portion

The upper accommodating portion 92 shown in FIG. 4 is an example of a second accommodating portion, and is provided at a +Y side end portion of the upper unit 14. Specifically, the upper accommodating portion 92 is formed in a groove shape in a portion that becomes the +Y side and the −Z side in a +X side portion of the upper main frame 52. In addition, the upper accommodating portion 92 is located, for example, on the +Z side with respect to the hinge portion 42.

Note that a +X side portion of the upper accommodating portion 92 with respect to the center of the upper accommodating portion 92 in the X-axis direction is configured by a support member 83 (FIG. 8) to be described later. That is, a part of a +X side opening of the upper accommodating portion 92 is covered with the support member 83.

Specifically, the upper accommodating portion 92 includes a vertical wall 92A formed along the Y-Z plane, a rear rib 92B protruding from the vertical wall 92A to the +X side, and a front convex portion 92C arranged on the +Y side with respect to the rear rib 92B at an interval from the rear rib 92B and protruding from the vertical wall 92A to the +X side. In other words, the upper accommodating portion 92 is a groove portion having a U-shaped cross section extending in an oblique direction toward a front upper side when viewed from the X-axis direction. A length of the rear rib 92B and the front convex portion 92C corresponding to a height from the vertical wall 92A is larger than a length corresponding to a width of an FFC 72 to be described later in the X-axis direction.

Support Member

Figure 8:
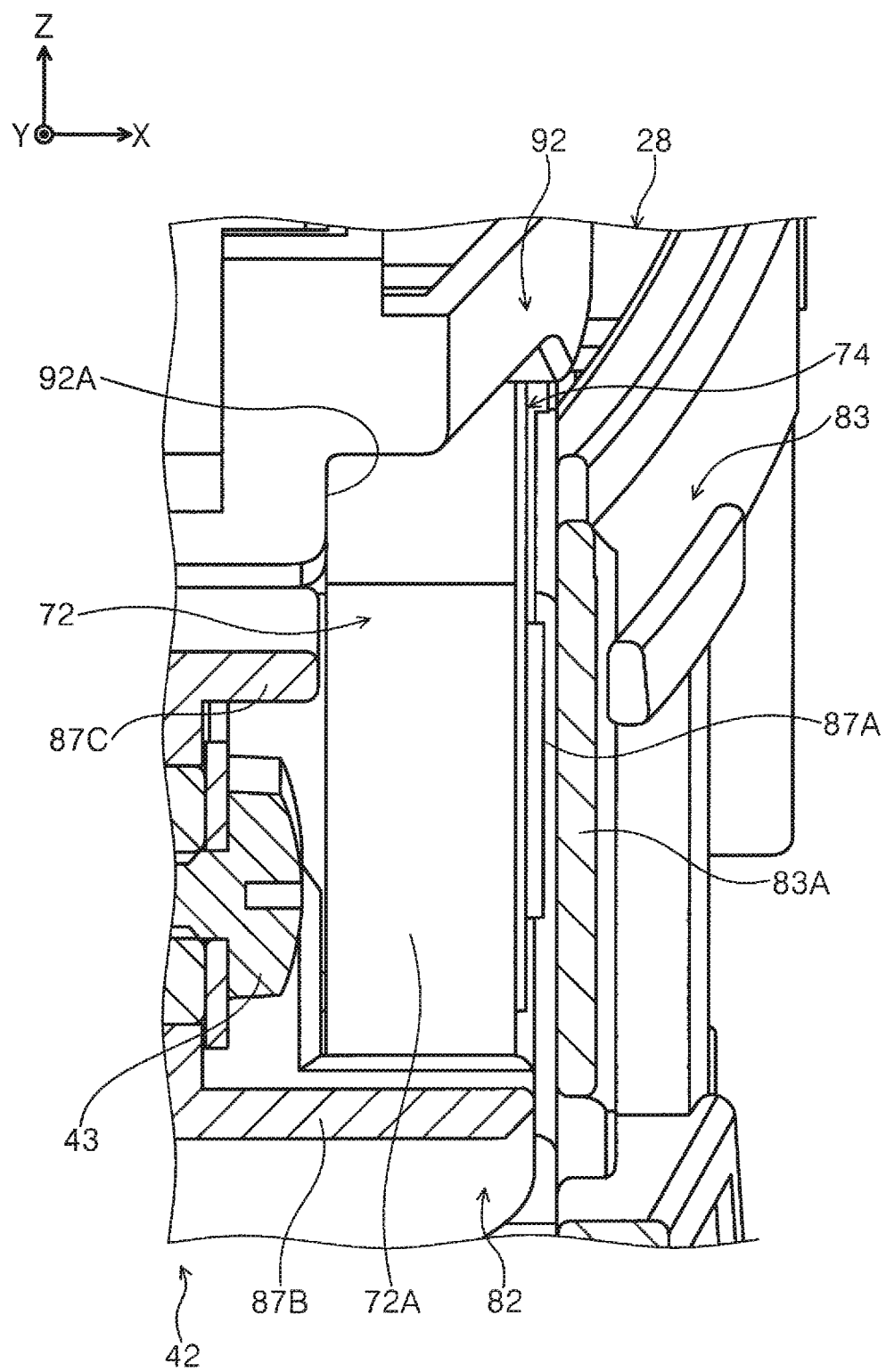
FIG. 8 is a partially enlarged view showing a structure of the accommodating portion of the scanner according to the first embodiment.

The support member 83 shown in FIG. 8 is an example of a restricting portion, and is attached to the side frame 28 using a screw (not shown). In addition, the support member 83 is provided on the lower accommodating portion 82 and the upper accommodating portion 92. Specifically, the support member 83 is located on the +X side with respect to the lower accommodating portion 82 and the upper accommodating portion 92, and covers a part of the lower accommodating portion 82 and a part of the upper accommodating portion 92 from the +X side. As a result, the support member 83 restricts movement of the FFC 72 to the +X side in the X-axis direction.

In addition, the support member 83 has a plate-shaped vertical wall portion 83A formed along the Y-Z plane. A +Z side end portion of the vertical wall portion 83A faces the vertical wall 92A in the X-axis direction. A part of the vertical wall portion 83A on the +Z side with respect to the center of the vertical wall portion 83A in the Z-axis direction and on the −Z side with respect to a +Z side end portion of the vertical wall portion 83A faces the upper rib 87C in the X-axis direction. A −Z side end portion of the vertical wall portion 83A extends up to a −X side end portion of the front rib 87B in the Z-axis direction.

FFC

Figure 6:
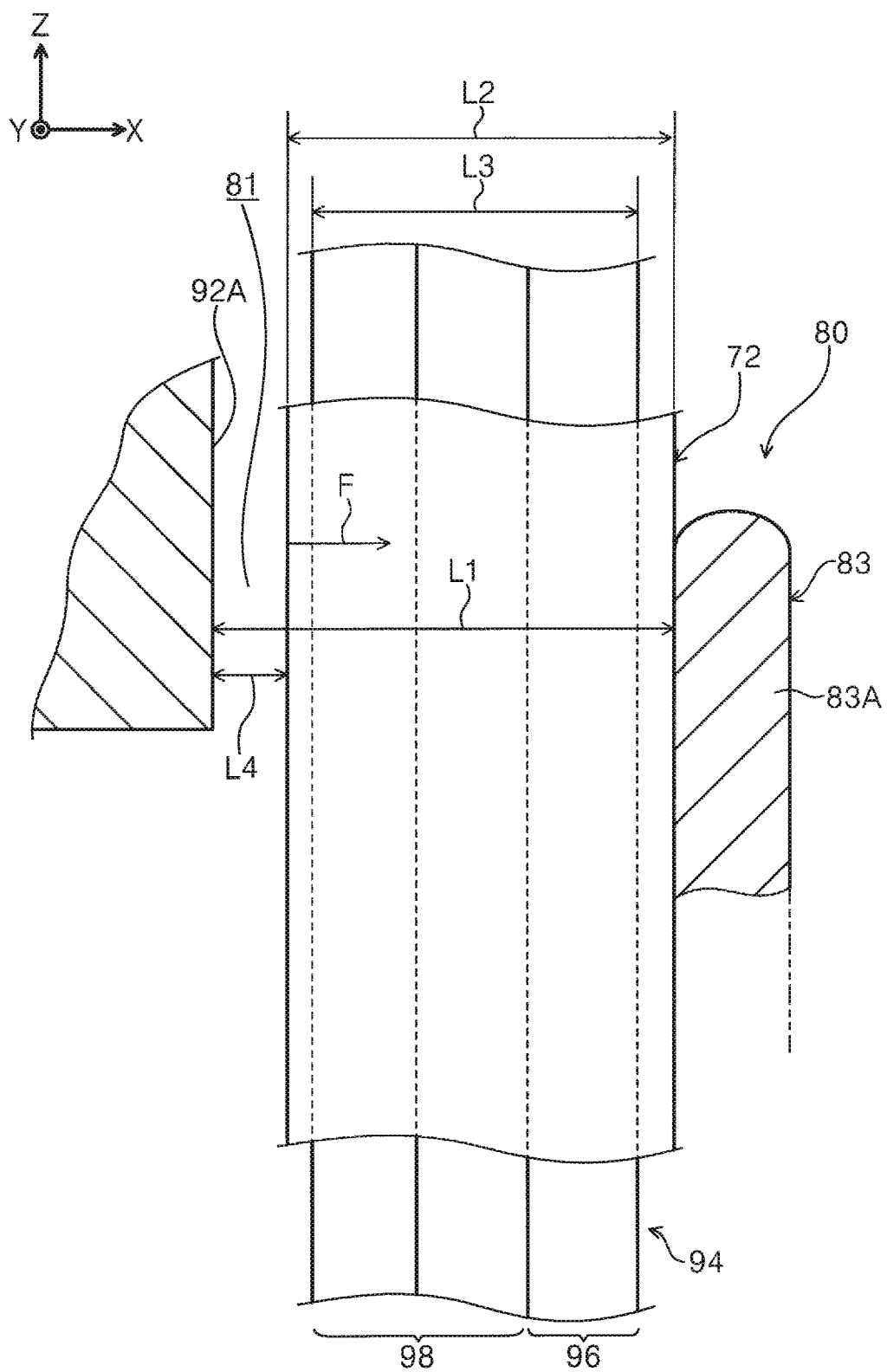
FIG. 6 is a schematic view showing a positional relationship between an accommodating portion, a ground (GND) harness, and a flexible flat cable (FFC) of the scanner according to the first embodiment.

The FFC 72 shown in FIG. 6 is an example of a signal wiring member. Specifically, the FFC 72 is a member in which a plurality of conductor wirings constituting a signal transmission path are arranged at regular intervals in a width direction and are covered with an insulating film such as a film and which is elongated in one direction. In the following description, a width direction of the FFC 72 will be described as the X-axis direction.

In addition, the FFC 72 has flexibility. The "flexibility" means a property of showing the ease of bending of a member when an external force is applied to the member. The phrase "has flexibility" means that the member bends when the external force is applied to the member.

Here, a length corresponding to an interval between the vertical wall portion 83A and the vertical wall 92A in the X-axis direction is L1 [mm]. In addition, a length corresponding to a width of the FFC 72 in the X-axis direction is L2 [mm]. A length corresponding to a width of a gap 81 between the FFC 72 and the vertical wall 92A when the FFC 72 is brought into contact with the vertical wall portion 83A is L4 [mm]. L4=L1−L2. In other words, the length L4 is a length corresponding to a width of a gap 81 between the accommodating portion 80 and the FFC 72 in the X-axis direction.

As shown in FIG. 4, the FFC 72 couples the main board 32 and the sub-board 56 to each other so that signals can be transmitted. A part of the FFC 72 adjacent to the main board 32 in a length direction is bent in a crank shape and is accommodated in the rear accommodating portion 84. A part of the FFC 72 adjacent to the sub-board 56 is bent into an L shape and is accommodated in the upper accommodating portion 92. A curved portion 72A curved so as to be convex toward the pivot axis C is formed in a central portion of the FFC 72 in the length direction.

The curved portion 72A is accommodated in the front accommodating portion 87. In addition, the curved portion 72A is curved in accordance with the pivot of the upper unit 14. In other words, a curved state of the curved portion 72A is changed in accordance with the pivot of the upper unit 14.

GND Harness and Wide Portion

The GND harness 94 shown in FIG. 7 is an example of a ground wiring member, and is a member elongated in one direction. Specifically, the GND harness 94 has a terminal portion 95A and a terminal portion 95B, a linear portion 96, and the widened portion 98. Further, the GND harness 94 has flexibility in the linear portion 96 and the widened portion 98. The linear part 96 is an example of a narrow portion. The widened portion 98 is an example of a wide portion.

In a width direction of the GND harness 94 orthogonal to a length direction of the GND harness 94, a length corresponding to a maximum width of the GND harness 94 is smaller than the length L2 (FIG. 6) corresponding to the width of the FFC 72. That is, the GND harness 94 has a width smaller than the width of the FFC 72. Here, the length direction of the GND harness 94 is referred to as an A-axis direction, and the width direction of the GND harness 94 is referred to as an X-axis direction. The A-axis direction and the X-axis direction are orthogonal to each other. In addition, a thickness direction orthogonal to each of the A-axis direction and the X-axis direction is referred to as a B-axis direction.

The terminal portion 95A and the terminal portion 95B are composed of conductive terminal members.

One end portion of the linear portion 96 in the A-axis direction is coupled to the terminal portion 95A. In addition, the terminal portion 95A is coupled to a ground portion of the main board 32 and the shield member 33 (FIG. 4). The other end portion of the linear portion 96 in the A-axis direction is coupled to the terminal portion 95B. In addition, the terminal portion 95B is coupled to a ground portion of the sub-board 56 (FIG. 4) and a shield plate (not shown) by co-tightening using a screw.

A central portion of the linear portion 96 in the A-axis direction is formed integrally with the widened portion 98. In addition, a core wire 97 for grounding is provided in the linear portion 96. The core wire 97 is connected from the terminal portion 95A to the terminal portion 95B via the linear portion 96. Note that the core wire is not provided in the widened portion 98.

Figure 14:
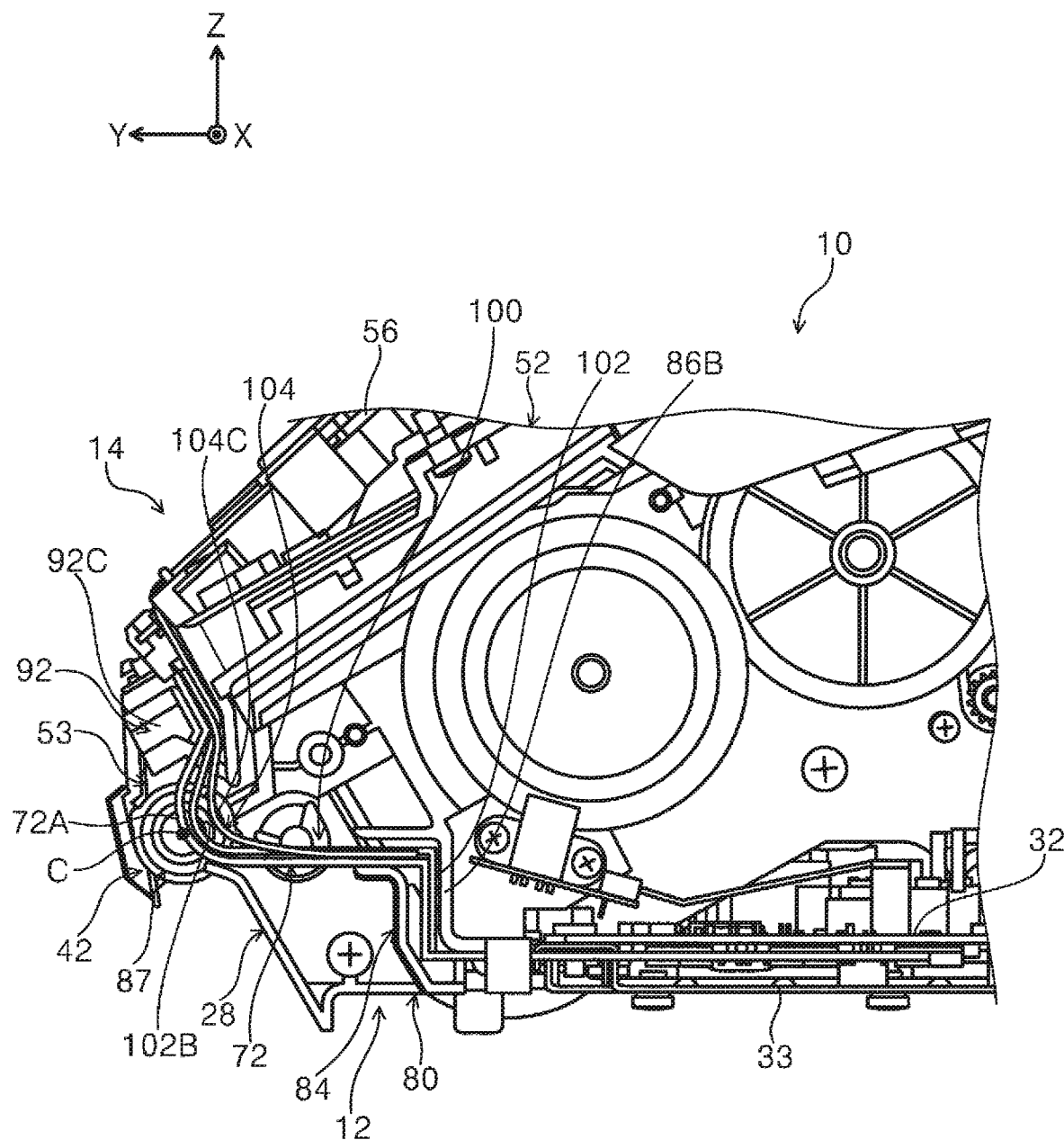
FIG. 14 is a side view showing an internal structure of an upper unit of a scanner according to a second embodiment in a closed state.

A length of the GND harness 94 in the A-axis direction is set to a length at which a bent portion is generated when the GND harness 94 is routed from the main board 32 (FIG. 14) to the sub-board 56 (FIG. 14) via the accommodating portion 80 (FIG. 14).

The GND harness 94 is formed by leaving only the core wire 97 in a ribbon harness including a plurality of conductive wire portions, removing the other core wires in the ribbon harness, and cutting off both end portions, in the A-axis direction, of a portion where a core wire other than the core wire 97 is inserted to leave the widened portion 98. The GND harness 94 couples the ground portion of the main board 32 (FIG. 4) and the ground portion of the sub-board 56 (FIG. 4) to each other.

The widened portion 98 is a portion widened in the X-axis direction from the linear portion 96. In addition, the widened portion 98 is formed in a rectangular plate shape elongated in the A-axis direction when viewed from the B-axis direction which is the thickness direction. A length of the widened portion 98 in the A-axis direction is L5 [mm]. The length L5 is set in accordance with a length of a routing path from the vertical wall portion 86B (FIG. 5) to a plate portion 55 (FIG. 10) to be described later. A length corresponding to a width of the widened portion 98 in the X-axis direction is larger than a length corresponding to a width of the linear portion 96 in the X-axis direction.

Through holes (not shown) penetrating the widened portion 98 in the A-axis direction are formed in the widened portion 98. In FIG. 7, as an example, two portions where only the through holes are formed are shown. An end surface of the widened portion 98 located adjacent to the main board 32 (FIG. 4) is referred to as an end surface 98A. In addition, an end surface of the widened portion 98 located adjacent to the sub-board 56 (FIG. 4) is referred to as an end surface 98B.

As shown in FIG. 6, a length corresponding to a width (maximum width) of the GND harness 94 in the X-axis direction is L3 [mm]. The length L3 is the sum of a length of the linear portion 96 and a length of the widened portion 98 in the X-axis direction. In addition, the length L3 is set to a length larger than the length L4 and smaller than the length L2. As such, the GND harness 94 has a width larger than the length L4, and has the widened portion 98 that widens a width of the linear portion 96 in the X-axis direction.

As shown in FIG. 4, the GND harness 94 is arranged on the −Y side or the +Z side with respect to the FFC 72, and couples the main board 32 and the sub-board 56 to each other in a conductive manner. A part of the GND harness 94 adjacent to the main board 32 in the length direction is bent in a crank shape and is accommodated in the rear accommodating portion 84. A part of the GND harness 94 adjacent to the sub-board 56 is bent into an L shape and is accommodated in the upper accommodating portion 92.

Figure 9:
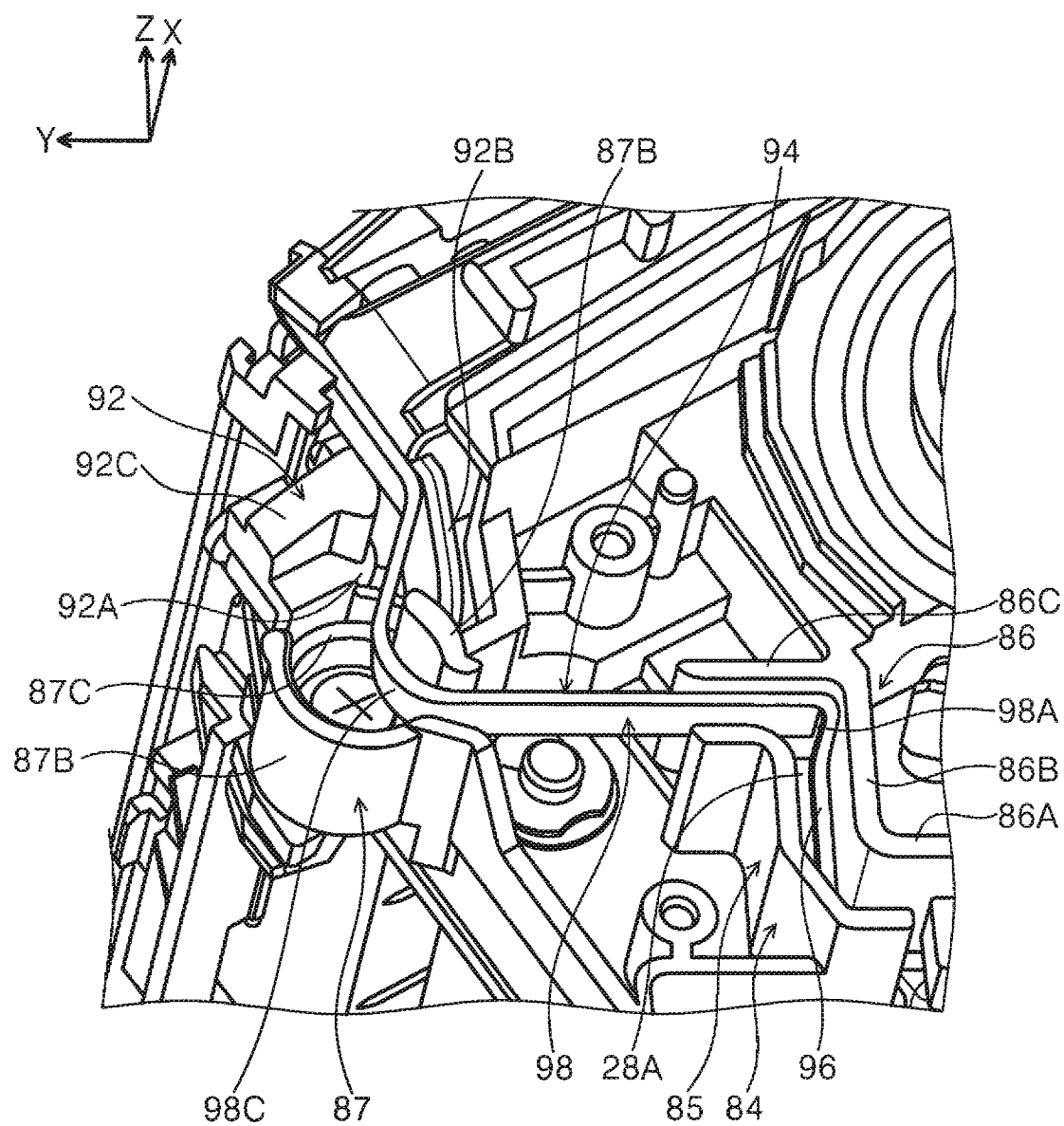
FIG. 9 is a perspective view showing an arrangement state of the GND harness in the accommodating portion of the scanner according to the first embodiment.

In FIG. 9, a routing state of only the GND harness 94 is shown. A curved portion 98C that is curved is formed at a central portion of the GND harness 94 in the length direction, which is the widened portion 98 of the GND harness 94. The curved portion 98C is accommodated in the front accommodating portion 87.

The widened portion 98 is formed, for example, in accordance with a section from a position facing the vertical wall portion 86B in the Y-axis direction to a position facing a plate portion 55 (FIG. 10) to be described later.

A portion of the linear portion 96 closer to the main board 32 (FIG. 4) than the widened portion 98 is bent to the −X side so as to face the end surface 98A in the Y-axis direction, is bent to the −Z side on a front side of the vertical wall 28A, is further bent to the −Y side in accordance with the lower wall portion 86A, and extends to the main board 32. As a result, in the GND harness 94, when the linear portion 96 is pulled to the −Z side or the −Y side, the end surface 98A comes into contact with the vertical wall portion 86B to restrict movement of the widened portion 98 toward the main board 32.

Figure 10:
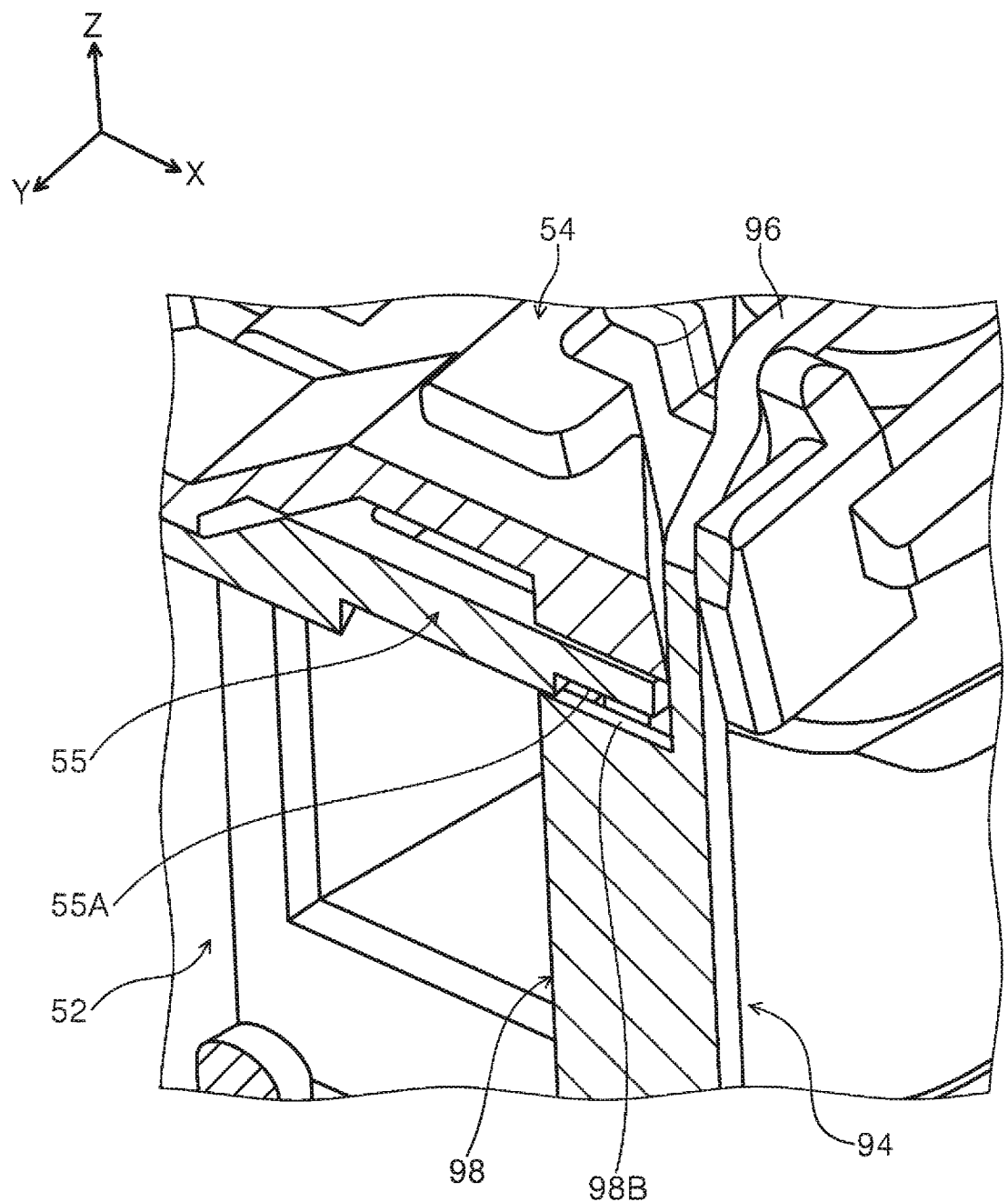
FIG. 10 is a partially enlarged view showing a positional relationship between an upper portion of the GND harness and an upper frame member of the scanner according to the first embodiment.

As shown in FIG. 10, a plate portion 55 elongated in the X-axis direction is formed at an +Y-side end portion of the upper sub-frame 54. The plate portion 55 is an example of a facing portion. A lower surface 55A of a +X side end portion of the plate portion 55 faces the end surface 98B of the widened portion 98 that stands upright in the Z-axis direction in the Z-axis direction. As a result, in the GND harness 94, when the linear portion 96 is pulled to the +Z side or the −Y side, the end surface 98B comes into contact with the plate portion 55 to restrict movement of the widened portion 98 toward the sub-board 56 (FIG. 3).

Figure 11:
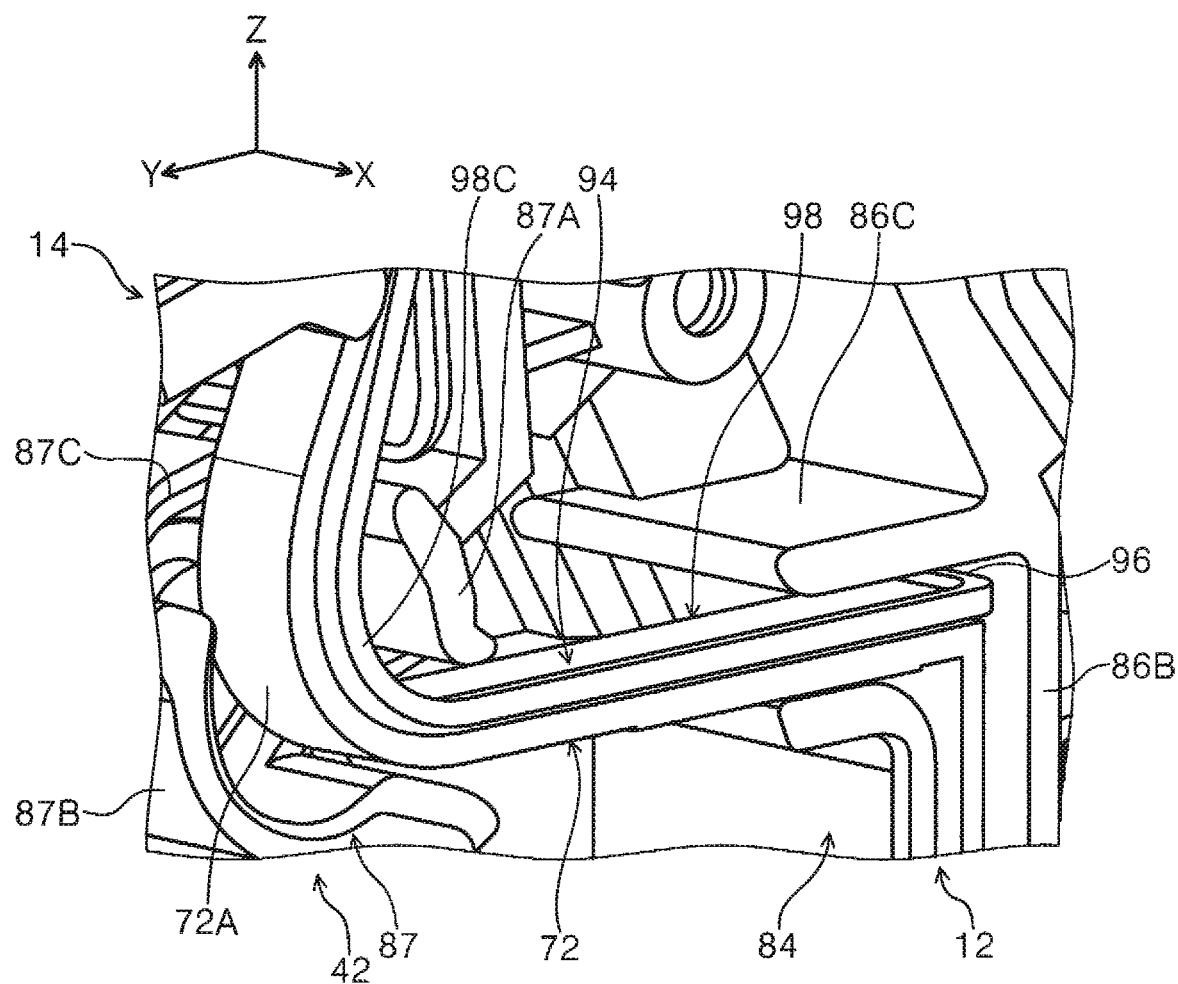
FIG. 11 is a partial perspective view showing a positional relationship between the accommodating portion, the GND harness, and the FFC of the scanner according to the first embodiment.

As shown in FIG. 11, the curved portion 98C of the widened portion 98 overlaps the curved portion 72A in a thickness direction of the FFC 72. Here, a state in which the curved portion 98C overlaps the curved portion 72A in the thickness direction is not limited to a state in which the curved portion 98C *comes* into contact with the curved portion 72A, and includes a state in which the curved portion 98C overlaps the curved portion 72A when the curved portion 98C is projected in the thickness direction in a state in which the curved portion 98C and the curved portion 72A do not come into contact with each other, as shown in FIG. 11.

The curved portion 98C and the curved portion 72A overlap each other in the thickness direction within the front accommodating portion 87 facing the hinge portion 42. A curvature of the curved portion 72A is set in advance so as not to affect a curved state of the curved portion 98C when the upper unit 14 is pivoted with respect to the lower unit 12.

Description of Operation and Effect of First Embodiment

A case where a −Y side end portion of the upper unit 14 is lifted to the +Z side in the closed state of the upper unit 14 shown in FIG. 2 will be described.

Figure 12:
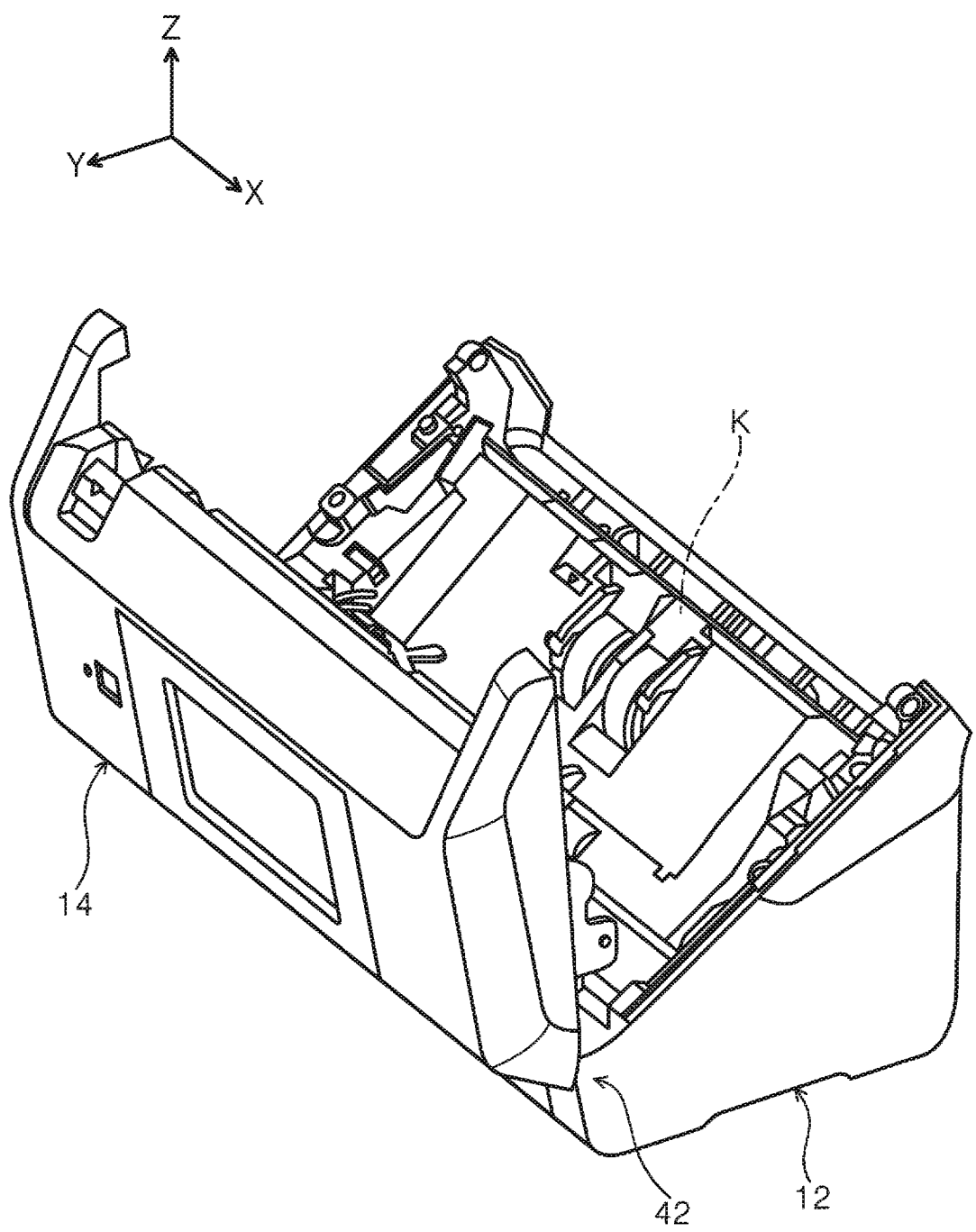
FIG. 12 is a perspective view showing an opened state of an upper unit of the scanner according to the first embodiment.

As shown in FIG. 12, the upper unit 14 is pivoted around the hinge portion 42, such that the upper unit 14 becomes an opened state in which the transport path K is exposed.

Figure 13:
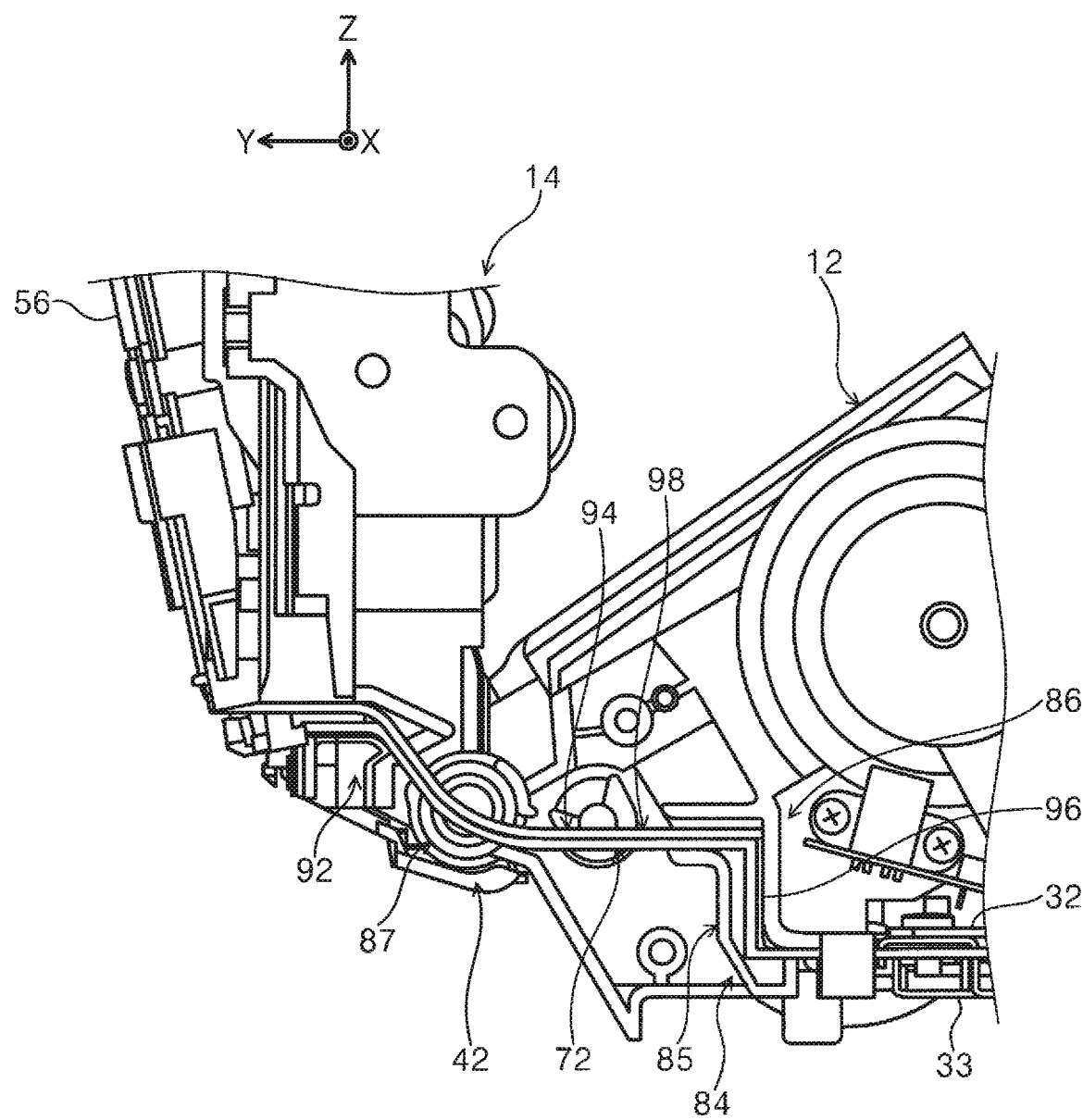
FIG. 13 is a side view showing an internal structure of the upper unit of the scanner according to the first embodiment in an opened state.

At this time, as shown in FIG. 13, in the GND harness 94, the terminal portion 95A (FIG. 7) is pulled toward the main board 32 and the terminal portion 95B (FIG. 7) is pulled toward the sub-board 56, such that the GND harness 94 becomes a stretched state in which a curvature of a curved state becomes small.

Here, as shown in FIG. 6, at a portion of the accommodating portion 80 where the gap 81 having the length L4 is formed, the length L3 corresponding to the width of the GND harness 94 is larger than the length L4, and it is thus suppressed that the GND harness 94 enters the gap 81, such that the FFC 72 is moved to the +X side. That is, it becomes difficult for a pressing force F allowing the GND harness 94 to move the FFC 72 to the +X side to act on the FFC 72, such that it is suppressed that the FFC 72 and a wall of the accommodating portion 80 come into contact with each other, and it is thus possible to suppress wear of an end portion of the FFC 72 in the X-axis direction.

Note that when the gap 81 is formed on the +X side, it is suppressed that the FFC 72 is pressed toward the vertical wall 92A. In addition, even when opening and closing of the upper unit 14 is repeated, it is possible to suppress wear of the FFC 72 by a similar action.

(1) Summarizing the above description, according to the first embodiment, the length L3 of the GND harness 94 is larger than the length L4 corresponding to the gap 81 between the accommodating 80 and the FFC 72 in the X-axis direction, and it is thus suppressed that the GND harness 94 enters the gap 81 between the accommodating portion 80 and the FFC 72. As a result, it is suppressed that the FFC 72 receives the pressing force F in the X-axis direction from the GND harness 94, such that the contact between the FFC 72 and the accommodating portion 80 is suppressed, and it is thus possible to suppress the wear of the FFC 72.

(2) According to the first embodiment, the widened portion 98 can be arranged only in the portion where the gap 81 between the accommodating portion 80 and the FFC 72 is formed, and it is thus possible to suppress that a part of the GND harness 94 becomes useless as compared with a configuration in which the entire GND harness 94 is the widened portion 98.

(3) According to the first embodiment, when the widened portion 98 is accommodated in the accommodating portion 80, the widened portion 98 is formed integrally with the linear portion 96, such that the linear portion 96 and the widened portion 98 are deformed at the same position in the length direction, and a work of accommodating the GND harness 94 in the accommodating portion 80 can thus be facilitated.

(4) According to the first embodiment, the widened portion 98 overlaps the curved portion 72A in the thickness direction. As a result, in the curved portion 72A of the FFC 72 more easily coming into contact with the accommodating portion 80 than in a straight line-shaped portion of the FFC 72, it is suppressed that the GND harness 94 enters the gap 81 between the curved portion 72A and the accommodating portion 80, and it is thus possible to further suppress the wear of the FFC 72.

(5) According to the first embodiment, by pivoting the upper unit 14 with respect to the lower unit 12, when the GND harness 94 is pulled toward the upper unit 14, the widened portion 98 comes into contact with the plate portion 55, such that the movement of the GND harness 94 and the widened portion 98 is restricted. In addition, in a process of routing the GND harness 94, when the GND harness 94 is pulled toward the main board 32, the widened portion 98 comes into contact with the vertical wall portion 86B, such that movement of the GND harness 94 and the widened portion 98 is restricted. As a result, it is possible to suppress positional deviation of the widened portion 98 in the length direction when the upper unit 14 is pivoted.

(6) According to the first embodiment, when the upper unit 14 is pivoted with respect to the lower unit 12, a displacement amount of the upper unit 14 is the smallest at the pivot shaft portion 53. Here, since displacement amounts of the FFC 72 and the GND harness 94 are reduced by locating a part of the accommodating portion 80 at a portion where the displacement amount of the upper unit 14 is the smallest, it is possible to suppress wear of the FFC 72 in accordance with the pivot of the upper unit 12.

(7) According to the first embodiment, the movement of the FFC 72 in the X-axis direction is restricted by the support member 83 in at least one of the lower accommodating portion 82 and the upper accommodating portion 92, such that the contact between the accommodating portion 80 and the FFC 72 is suppressed, and it is thus possible to suppress the wear of the FFC 72 as compared with a configuration that does not have the support member 83.

Second Embodiment

Next, a second embodiment as an example of an image reading apparatus according to the present disclosure will be described. Note that the same portions as those of the first embodiment are denoted by the same reference numerals and a description thereof will be omitted. In addition, a description of an operation and an effect similar to those of the first embodiment will be omitted.

As shown in FIG. 14, in a scanner 10, a wire harness 100 may be used instead of the GND harness 94 (FIG. 4).

Figure 15:
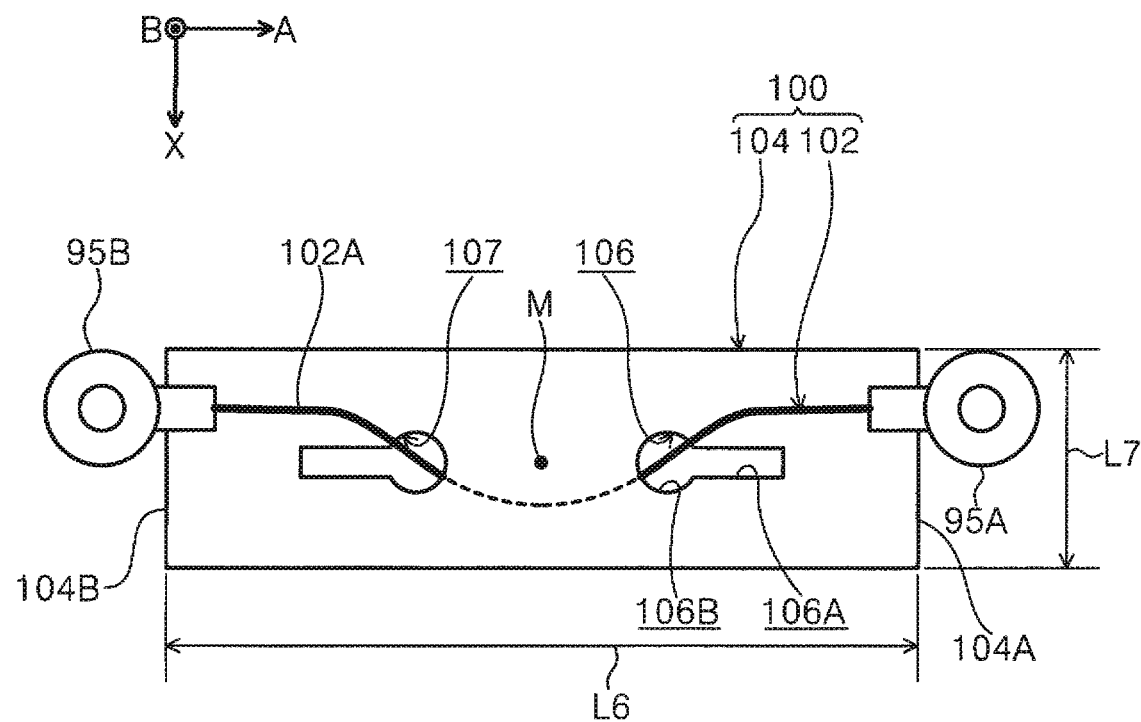
FIG. 15 is a schematic diagram showing a GND harness and a Lumirror (registered trademark) of the scanner according to the second embodiment.

The wire harness 100 shown in FIG. 15 is an example of a ground wiring member. In addition, the wire harness 100 includes a GND wire 102 as an example of a narrow portion and a linear member and a sheet member 104 as an example of a wide portion and a plate-shaped member.

The GND wire 102 is composed of a core wire (not shown) and a covering portion 102A covering the core wire, and has flexibility. A terminal portion 95A is coupled to one end portion of the GND wire 102 in an axial direction, and a terminal portion 95B is coupled to the other end portion of the GND wire 102 in the axial direction. A thickness of the GND wire 102 is a thickness at which the GND wire 102 can be accommodated in an accommodating portion 80. A length of the GND wire 102 is set to a length at which a bent portion is generated when the GND wire 102 is routed from a main board 32 (FIG. 14) to a sub-board 56 (FIG. 14) via the accommodating portion 80 (FIG. 14).

The sheet member 104 is provided separately from the GND wire 102 and is provided on the GND wire 102. In addition, the sheet member 104 is composed of, for example, a plate-shaped Lumirror (registered trademark) and has flexibility. An outer shape of the sheet member 104 is rectangular when viewed from a thickness direction. Note that a longitudinal direction of the sheet member 104 is referred to as an A-axis direction. In addition, a thickness direction of the sheet member 104 is referred to as a B-axis direction. Further, a transverse direction of the sheet member 104 is referred to as an X-axis direction.

A length L6 of the sheet member 104 in the A-axis direction is set, for example, in accordance with a section from a position facing a vertical wall portion 86B (FIG. 14) in an Y-axis direction to a position where the sheet member 104 is bent in an L shape between an upper accommodating portion 92 (FIG. 14) and the sub-board 56 (FIG. 14). Note that the length L6 may be set to the same length as the length L5 (FIG. 7) described above.

An end surface of the sheet member 104 located adjacent to the main board 32 (FIG. 14) is referred to as an end surface 104A. An end surface of the sheet member 104 located adjacent to the sub-board 56 (FIG. 14) is referred to as an end surface 104B.

In the X-axis direction, a length corresponding to a width of the sheet member 104 is L7 [mm]. The length L7 is set to be larger than the length L4 (FIG. 6) described above and smaller than the length L2 (FIG. 6). In addition, the length L7 of the sheet member 104 is larger than a length corresponding to a width of the GND wire 102 in the X-axis direction.

As a result, in the X-axis direction, a length corresponding to a width (maximum width) of the wire harness 100 is larger than the length L4.

As an example of a plurality of hole portions, a hole portion 106 and a hole portion 107 penetrating the sheet member 104 in the B-axis direction are formed in the sheet member 104. As an example, the hole portion 106 and the hole portion 107 are formed on one side and the other side of the sheet member 104, respectively, to be symmetrical to each other with respect to the center M in the A-axis direction. For this reason, the hole portion 106 will be described, and a description of the hole portion 107 will be omitted.

The hole portion 106 has a straight line portion 106A extending in the A-axis direction and a circular portion 106B formed at a portion of the straight line portion 106A adjacent to the center M and having a circular shape. A size of the hole portion 106 is a size at which the terminal portion 95A can be inserted through the hole portion 106. The GND wire 102 is inserted through the hole portion 106 and the hole portion 107.

Here, the terminal portion 95A and one end portion of the GND wire 102 are inserted through the hole portion 106 and the terminal portion 95B and the other end portion of the GND wire 102 are inserted through the hole portion 107, such that the wire harness 100 is obtained. In other words, the wire harness 100 has a configuration in which the GND wire 102 is provided with the sheet member 104.

In the wire harness 100, the terminal portion 95A, the terminal portion 95B, and both end portions of the GND wire 102 in the A-axis direction are arranged on one side of the sheet member 104 in the B-axis direction. In addition, a center portion of the GND wire 102 in the A-axis direction is arranged on the other side of the sheet member 104 in the B-axis direction.

As shown in FIG. 14, in a state where the wire harness 100 is accommodated in the accommodating portion 80, a curved portion 102B of the GND wire 102 is located more adjacent to a +Y side than a curved portion 104C of the sheet member 104 is, within a front accommodating portion 87. In other words, within the front accommodating portion 87, the sheet member 104 is located farther from a pivot axis C in a radial direction than the GND wire 102 is. As a result, when an upper unit 14 is in an opened state, the sheet member 104 restricts the GND wire 102 from being away from the pivot axis C to approach a straight line-shaped stretched state.

The curved portion 104C of the sheet member 104 overlaps a curved portion 72A of an FFC 72 in a thickness direction of the FFC 72. In other words, the curved portion 104C is located so as to overlap the curved portion 72A when projected in the thickness direction. In addition, in the sheet member 104, the end surface 104A (FIG. 15) faces the vertical wall portion 86B in the Y-axis direction, and the end surface 104B (FIG. 15) faces the lower surface 55A (FIG. 10) in the Z-axis direction.

Description of Operation and Effect of Second Embodiment (1) According to the second embodiment, the sheet member 104 is configured as a plate-shaped member separate from the GND wire 102. As a result, a position of the sheet member 104, that is, a position of the wide portion is shifted in the A-axis direction (FIG. 15) intersecting with the X-axis direction of the GND wire 102, and adjustment of the position of the wide portion of the wire harness 100 can thus be facilitated.

In addition, when the upper unit 14 is in the opened state, the sheet member 104 restricts the GND wire 102 from approaching a straight line state. As a result, it is possible to suppress that a load acting on a coupled portion of the wire harness 100 to the main board 32 and a load acting on a coupled portion of the wire harness 100 to the sub-board 56 increase.

(2) According to the second embodiment, the sheet member 104 overlaps the curved portion 72A in the thickness direction. As a result, it is suppressed that the GND wire 102 enters the gap 81 in the curved portion 72A that is likely to come into contact with the accommodating portion 80, and it is thus possible to further suppress wear of the FFC 72.

(3) According to the second embodiment, by pivoting the upper unit 14, when the GND wire 102 is pulled toward the upper unit 14, the end surface 104B comes into contact with the plate portion 55 (FIG. 10), such that the movement of the sheet member 104 is restricted. In addition, in a process of routing the wire harness 100, when the GND wire 102 is pulled toward the main board 32, the end surface 104A comes into contact with the vertical wall portion 86B, such that movement of the sheet member 104 is restricted. As a result, it is possible to suppress positional deviation of the sheet member 104 in the length direction when the upper unit 14 is pivoted.

Other Embodiments

Figure 16:
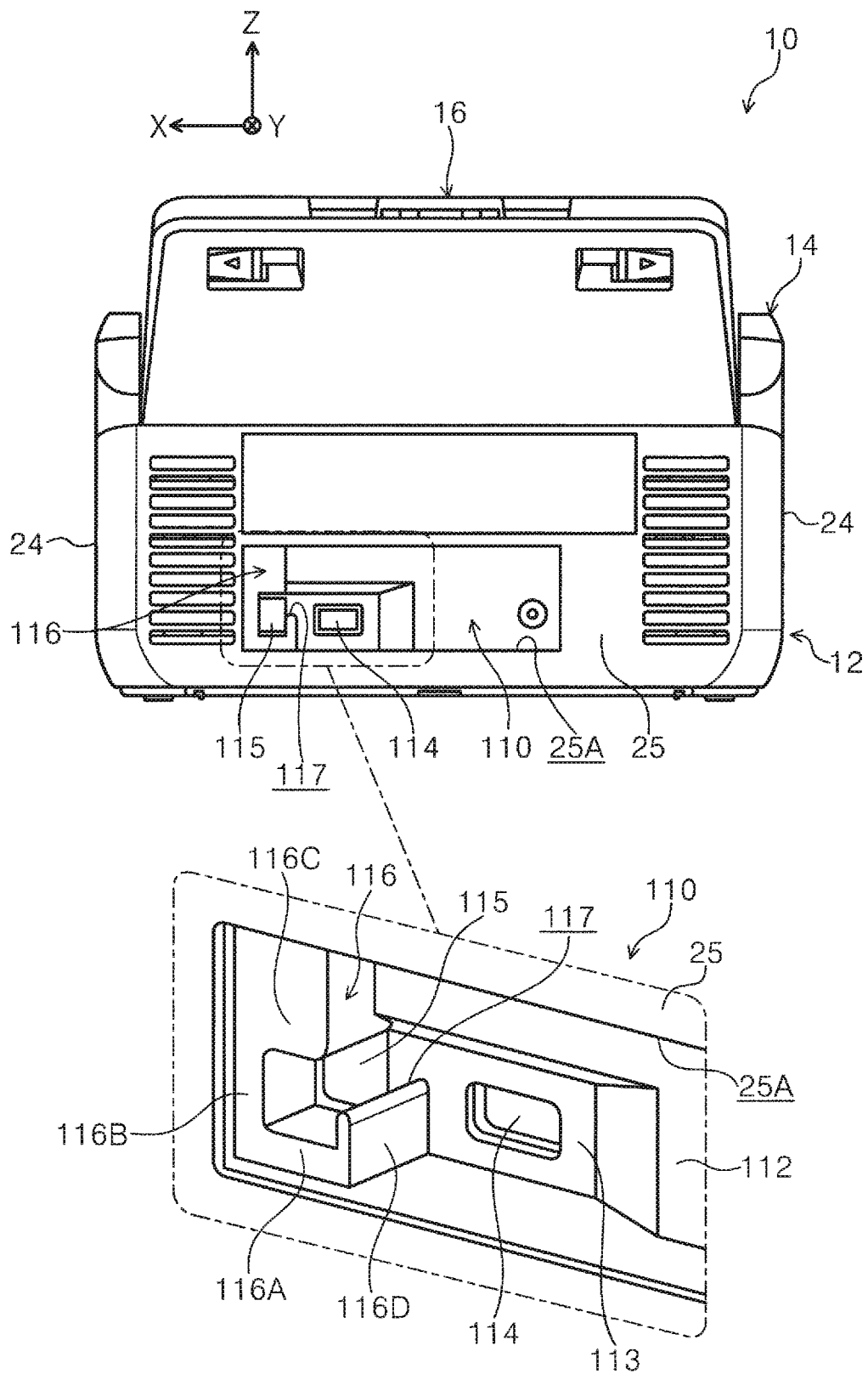
FIG. 16 is a rear view of the scanner according to the first embodiment.

As shown in FIG. 16, an interface portion 110 is provided at a central lower portion of a rear cover 25 of a scanner 10.

The interface portion 110 is exposed to a −Y side through an opening 25A formed in the rear cover 25. In addition, the interface portion 110 has a side wall 112 located on a +Y side with respect to the rear cover 25 and formed along an X-Z plane. A concave portion 113 recessed toward the +Y side is formed in a part of the side wall 112. A first connector 114 to which a Type-A universal serial bus (USB) connector is coupled and a second connector 115 to which a Type-B USB connector is coupled are provided at a portion corresponding to a bottom portion of the concave portion 113. The second connector 115 is located on a +X side with respect to the first connector 114. Note that in FIG. 16, illustration of each USB connector is omitted.

A protrusion portion 116 whose end surface is located on the −Y side with respect to the side wall 112 is formed at a peripheral edge of the second connector 115. The protrusion portion 116 has a lower wall portion 116A, a vertical wall portion 116B, an upper wall portion 116C, and a partition wall 116D when viewed from a Y-axis direction, and surrounds the second connector 115 except for a part of an outer edge of the second connector 115.

The lower wall portion 116A is located on the −Z side with respect to the second connector 115.

The vertical wall portion 116B stands upright toward a +Z side at a +X side end portion of the lower wall portion 116A.

The upper wall portion 116C extends from a +Z side end portion of the vertical wall portion 116B to a −X side.

The partition wall 116D stands upright toward the +Z side at a −X side end portion of the lower wall portion 116A, and partitions a portion provided with the first connector 114 and a portion provided with the second connector 115 in an X-axis direction. A height of the partition wall 116D in a Z-axis direction is lower than that of the vertical wall portion 116B in the Z-axis direction. In other words, an opening 117 is formed by cutting a portion from a −X side end portion of the upper wall portion 116C to a +Z side end portion of the partition wall 116D in a portion of the protrusion portion 116 located at the peripheral edge of the second connector 115 when viewed from the Y-axis direction.

In the protrusion portion 116, when a USB cable having a Type-B connector is coupled to the second connector 115, movement of the Type-B connector in the Z-axis direction is restricted by the lower wall portion 116A and the upper wall portion 116C. Further, movement of the Type-B connector in the X-axis direction is restricted by the vertical wall portion 116B and the partition wall 116D. As a result, it is possible to suppress that the second connector 115 is deformed when an external force in the X-axis direction or the Z-axis direction acts on the Type-B connector.

In addition, visibility of the second connector 115 is improved by forming the opening 117 in the protrusion portion 116. Further, a space portion around the first connector 114 is expanded in the X-axis direction by forming the opening 117, and a coupling work and a decoupling work of the connector (not shown) to and from the first connector 114 can thus be facilitated. In particular, it is easy to perform a work when a coupling member that has a small length in the Y-axis direction and is difficult to grip is coupled and decoupled.

The scanner 10 according to the first and second embodiments of the present disclosure basically has the configuration as described above, but it is, of course, possible to change or omit a partial configuration without departing from the scope of the present disclosure.

A printer, which is a recording apparatus, may be configured by providing an image forming portion as a recording portion instead of the reading portion 30 and replacing the document G with a medium such as a sheet in the scanner 10. Note that a recording manner of the printer may be any one of an inkjet manner and an electrophotographic manner.

The signal wiring member is not limited to the FFC 72, and for example, a flexible printed circuit board (FPC) in which a printed circuit is formed on an insulating member such as a resin film may be used as the signal wiring member.

In the scanner 10, the widened portion 98 and the sheet member 104 may not overlap the curved portion 72A in the thickness direction.

A part of the accommodating portion 80 may not overlap the pivot shaft portion 53 in the pivot axis direction of the upper unit 14.

The support member 83 may not be provided, and walls may be formed on both sides of the accommodating portion 80 in the width direction. In addition, the support member 83 may be provided in only any one of the lower accommodating portion 82 and the upper accommodating portion 92.

Any one or both of the plate portion 55 and the vertical wall portion 86B may not be provided.

A shape of the rear accommodating portion 84 is not limited to the crank shape, and may be an S shape, when viewed from the X-axis direction.

What is claimed is:
1. An image reading apparatus comprising:
a lower unit that includes a first circuit board;
an upper unit that includes a second circuit board and is pivotably connected to the lower unit;
a signal wire that has flexibility and couples the first circuit board and the second circuit board to each other, the signal wire including a plurality of conductor wires that constitute a signal path between the first and second circuit boards;

a ground wire that has flexibility and couples the first circuit board and the second circuit board to each other, the ground wire including a plurality of conductor wires; and an accommodating portion that is provided in at least one of the lower unit or the upper unit and accommodates the signal wire and the ground wire, wherein a length of the ground wire in a width direction is longer in length corresponding to a gap between the accommodating portion and the signal wire in the width direction.

2. The image reading apparatus according to claim 1, wherein the ground wire includes:

a narrow portion; and a wide portion that has a width larger than a length corresponding to a width of the narrow portion in the width direction.

3. The image reading apparatus according to claim 2, wherein the wide portion is formed integrally with the narrow portion and is widened in the width direction from the narrow portion.

4. The image reading apparatus according to claim 2, wherein the narrow portion is a linear member, and the wide portion is a plate-shaped member which is provided separately from the linear member and has a width larger than a length of the narrow portion in the width direction, and in which a plurality of hole portions through which the narrow portion is inserted are formed.

5. The image reading apparatus according to claim 2, wherein the wide portion overlaps a curved portion of the signal wire curved in accordance with pivot of the upper unit, in a thickness direction of the signal wire.

6. The image reading apparatus according to claim 2, wherein the accommodating portion is provided with a facing portion facing the wide portion in a length direction of the ground wire.

7. The image reading apparatus according to claim 1, wherein a part of the accommodating portion overlaps a pivot shaft portion in an axial direction of the pivot shaft portion, the pivot shaft portion connecting the lower unit and the upper unit to each other.

8. The image reading apparatus according to claim 1, wherein the accommodating portion includes a first accommodating portion provided in the lower unit and a second accommodating portion provided in the upper unit, and at least one of the first accommodating portion and the second accommodating portion is provided with a restricting portion that restricts movement of the signal wire in the width direction.

* * * * *